US008398868B2

(12) United States Patent
Cheng et al.

(10) Patent No.: US 8,398,868 B2
(45) Date of Patent: *Mar. 19, 2013

(54) DIRECTED SELF-ASSEMBLY OF BLOCK COPOLYMERS USING SEGMENTED PREPATTERNS

(75) Inventors: Joy Cheng, San Jose, CA (US); Kafai Lai, Hopewell Junction, NY (US); Wai-Kin Li, Hopewell Junction, NY (US); Young-Hye Na, San Jose, CA (US); Charles Rettner, San Jose, CA (US); Daniel P. Sanders, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 974 days.

This patent is subject to a terminal disclaimer.

(21) Appl. No.: 12/468,391

(22) Filed: May 19, 2009

(65) Prior Publication Data

US 2010/0294740 A1 Nov. 25, 2010

(51) Int. Cl.
*B44C 1/22* (2006.01)
*H01L 21/302* (2006.01)
*H01L 21/312* (2006.01)

(52) U.S. Cl. ............ 216/18; 216/39; 216/41; 216/55; 216/67; 427/98.4; 427/99.2; 427/256

(58) Field of Classification Search .................. None
See application file for complete search history.

(56) References Cited

U.S. PATENT DOCUMENTS

| 6,630,404 | B1 | 10/2003 | Babcock |
| 7,347,953 | B2 * | 3/2008 | Black et al. ............ 216/83 |
| 7,405,147 | B2 | 7/2008 | Edelstein et al. |
| 7,514,339 | B2 | 4/2009 | Yang et al. |
| 7,767,099 | B2 * | 8/2010 | Li et al. ............... 216/2 |
| 7,790,045 | B1 * | 9/2010 | Chuang et al. .......... 216/2 |
| 8,114,306 | B2 * | 2/2012 | Cheng et al. .......... 216/41 |
| 2005/0158988 | A1 | 7/2005 | Lee et al. |
| 2005/0167838 | A1 | 8/2005 | Edelstein et al. |
| 2006/0078681 | A1 | 4/2006 | Hieda et al. |

(Continued)

FOREIGN PATENT DOCUMENTS

WO WO 2008130847 A1 10/2008

OTHER PUBLICATIONS

Sang-Min Park et al., "Patterning sub-10 nm line patterns from a block copolymer hybrid", Nanotechnology, vol. 19, No. 45, Nov. 2008, pp. 1-6.

(Continued)

*Primary Examiner* — Anita Alanko
(74) *Attorney, Agent, or Firm* — Daniel E. Johnson (57) ABSTRACT

An opening in a substrate is formed, e.g., using optical lithography, with the opening having sidewalls whose cross section is given by segments that are contoured and convex. The cross section of the opening may be given by overlapping circular regions, for example. The sidewalls adjoin at various points, where they define protrusions. A layer of polymer including a block copolymer is applied over the opening and the substrate, and allowed to self-assemble. Discrete, segregated domains form in the opening, which are removed to form holes, which can be transferred into the underlying substrate. The positions of these domains and their corresponding holes are directed to predetermined positions by the sidewalls and their associated protrusions. The distances separating these holes may be greater or less than what they would be if the block copolymer (and any additives) were to self-assemble in the absence of any sidewalls.

36 Claims, 9 Drawing Sheets

U.S. PATENT DOCUMENTS

| | | | |
|---|---|---|---|
| 2007/0175859 | A1 | 8/2007 | Black et al. |
| 2007/0224823 | A1 | 9/2007 | Sandhu |
| 2007/0293041 | A1 | 12/2007 | Yang et al. |
| 2008/0085601 | A1 | 4/2008 | Park et al. |
| 2008/0093743 | A1 | 4/2008 | Yang et al. |
| 2008/0099845 | A1 | 5/2008 | Yang et al. |
| 2008/0179667 | A1 | 7/2008 | Yang et al. |
| 2008/0299353 | A1 | 12/2008 | Stoykovich et al. |
| 2009/0026574 | A1 | 1/2009 | Kim et al. |
| 2009/0093133 | A1 | 4/2009 | Doris et al. |
| 2009/0200646 | A1 | 8/2009 | Millward et al. |
| 2009/0214823 | A1 | 8/2009 | Cheng et al. |
| 2012/0289051 | A1* | 11/2012 | Kim et al. .................... 438/702 |

OTHER PUBLICATIONS

Cheolmin Park et al., "Enabling nanotechnology with self assembled block copolymer patterns", Polymer, vol. 44, No. 22, Oct. 2003, pp. 6725-6760.

PCT International Search Report Dated Mar. 9, 2011, PCT Application No. PCT/EP2010/055412.

Wai-Kin Li et al., "Creation of sub-20-nm contact using diblock copolymer on a 300 mm wafer for complementary metal oxide semiconductor applications", J. Vac. Sci. Technol. B 25(6), Nov./Dec. 2007, pp. 1982-1984.

Joy Y. Cheng et al., "Nanostructure engineering by templated self-assembly of block copolymers", Nature Materials vol. 3, Nov. 2004, pp. 823-828.

Joy Y. Cheng et al., "Fabrication of nanostructures with long-range order using block copolymer lithography", Applied Physics Letters, vol. 81, No. 19, Nov. 4, 2002, pp. 3657-3659.

Joy Y. Cheng et al., "Templated Self-Assembly of Block Copolymers: Top-Down Helps Bottom-Up", Advanced Materials, vol. 18, 2006, pp. 2505-2521.

Joy Y. Cheng et al., "Templated Self-Assembly of Block Copolymers: Effect of Substrate Topography", Advanced Materials, vol. 15, Oct. 2, 2003, pp. 1599-1602.

* cited by examiner

Discrete Holes
FIG.1A
(Prior Art)

FIG.1B
(Prior Art)

Discrete Holes
FIG.1C
(Prior Art)

Linear Trench

Discrete Holes in Linear Trench

FIG.2C (Prior Art)

Indentation
FIG. 3A
(Prior Art)

↓ Coat with Polymer

FIG. 3B
(Prior Art)

↓ Remove Discrete Segregated Domains

Discrete Holes in Linear Trench
FIG. 3C
(Prior Art)

Coat with Polymer

FIG.5B

Selectively Remove Discrete Segregated Domains

DIRECTED SELF-ASSEMBLY OF BLOCK COPOLYMERS USING SEGMENTED PREPATTERNS

TECHNICAL FIELD

The invention relates to methods of forming structures at the nanoscale level. More particularly, the invention relates to using block copolymers to form devices having holes or vias at predetermined positions.

BACKGROUND

A semiconductor device typically includes a network of circuits that are formed over a substrate. The device may consist of several layers of circuit wiring, with various interconnects being used to connect these layers to each other and any underlying transistors. Generally, as a part of the manufacturing process, vias or contact holes (hereafter, collectively referred to as vias) are formed, which are transferred to another layer and then filled with a metal to form interconnects, so that the various layers of circuitry are in electrical communication with each other. Prior art methods of forming interconnects generally rely on a series of lithographic and etching steps to define the positions and dimensions of the vias, which in turn define the positions and dimensions of the corresponding interconnects. To this end, photoresists and hard masks may be employed. However, the dimensions of features formed using conventional optical lithography techniques for volume manufacturing (e.g., 193 nm dry and immersion lithography) have reached the resolution limit of the lithographic tools.

The creation of vias with smaller critical dimensions (CDs), tighter pitches, and better CD uniformity is one of major challenges for future technology nodes; however, printing such via patterns beyond the 22 nm node is expected to be difficult using conventional optical lithography, even with expensive and complicated double patterning processes, resolution enhancement technology (computational lithography) and severe layout design restrictions. Unfortunately, no alternative non-optical lithographic technique with higher resolution capabilities, such as e-beam lithography or extreme ultraviolet lithography (EUV), appears to be ready for high volume manufacturing in the near future. While e-beam direct write lithography is capable of very high resolution, it is a direct-write technique and cannot achieve the necessary wafer throughput levels to make it viable for volume manufacturing. EUV lithography tools have been under development for many years; however, many challenges associated with the source, collection optics, masks, and resists still remain and will likely delay any practical implementation of EUV lithography for several years.

Block copolymer (BCP) patterning has attracted attention as a possible solution to the problem of creating patterns with smaller dimensions. Under the right conditions, the blocks of such copolymers phase separate into microdomains (also known as "microphase-separated domains" or "domains") to reduce the total free energy, and in the process, nanoscale features of dissimilar chemical composition are formed. The ability of block copolymers to form such features recommends their use in nanopatterning, and to the extent that features with smaller CDs can be formed, this should enable the construction of features which would otherwise be difficult to print using conventional lithography. However, without any guidance from the substrate, the microdomains in a self-assembled block copolymer thin film are typically not spatially registered or aligned.

To address the problem of spatial registration and alignment, directed self-assembly (DSA) has been used. This is a method that combines aspects of self-assembly with a lithographically defined substrate to control the spatial arrangement of certain self-assembled BCP domains. One DSA technique is graphoepitaxy, in which self-assembly is guided by topographical features of lithographically pre-patterned substrates. BCP graphoepitaxy provides sub-lithographic, self-assembled features having a smaller characteristic dimension than that of the prepattern itself.

Figure 1A:
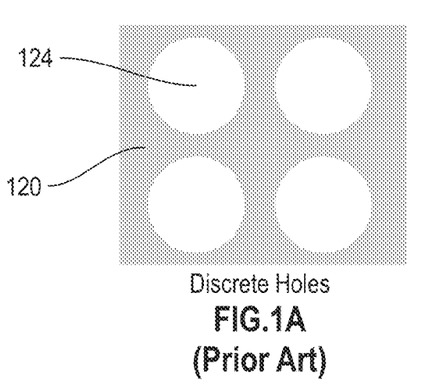
FIGS. 1A, 1B, and 1C, illustrates a prior art technique in which, beginning with openings in a substrate, smaller holes can be formed using a self-assembled block copolymer.
Figure 1B:
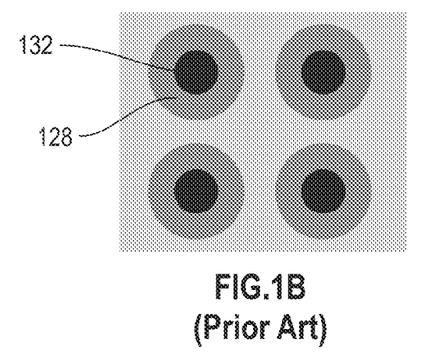
Figure 1C:
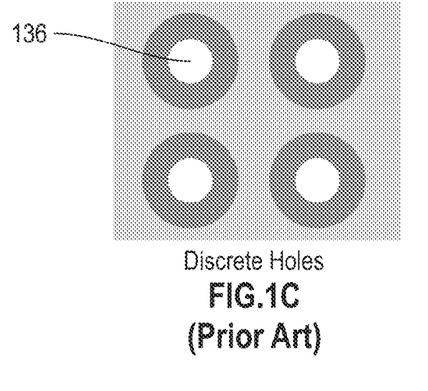

Some initial applications of DSA based on BCP graphoepitaxy have been reported. Directed self-assembly of block copolymers has been used to reduce the diameter of holes created with conventional lithographic methods, as illustrated in FIG. 1 (see, for example, US Published Patent Application 20080093743A1). With this technique, a solution containing a block copolymer is applied on a topographical substrate 120 having openings 124 therein (FIG. 1A), thereby filling the openings. (For the sake of clarity, only a portion of the substrate is shown in each of the figures herein.) Microphase-separated domains 128 and 132 are then formed in the openings 124 (FIG. 1B) as a result of an annealing process. The discrete, segregated polymer domains 132 formed in the centers of the openings 124 are subsequently removed via an etch process to create holes 136 that are smaller than the corresponding openings 124. Note, however, that the pitch of the pattern realized with this approach is unchanged from the pitch of the starting lithographic pre-pattern (i.e., there is no increase in pattern density).

Figure 2A:
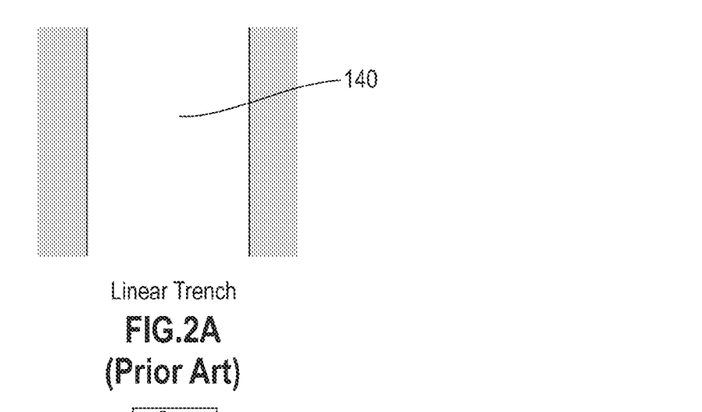
FIGS. 2A, 2B, and 2C, illustrates a prior art technique in which, beginning with a trench in a substrate, multiple holes can be formed using a self-assembled block copolymer.
Figure 2B:
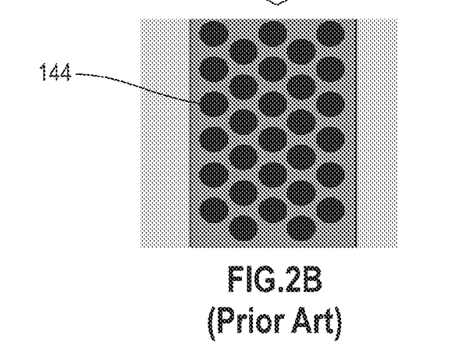
Figure 2C:
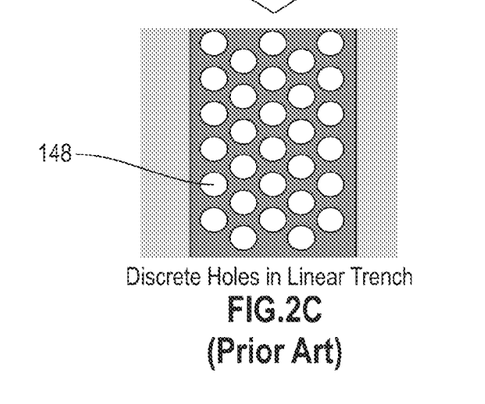

Overall pattern density (related here to the smaller CD and smaller pitch) has been increased by creating an array of self-assembled polymer domains in a lithographically defined trench 140, as shown in FIG. 2A (see Cheng et. al., *Applied Physics Letters*, 2002, 81, 3657). However, there was effectively no control of the placement of each self-assembled domain 144 (FIG. 2B), and hence no control over the final location of the corresponding holes 148 generated as a result of the etch process (FIG. 2C). Thus, these holes 148 do not form an array in which the domains have predetermined positions, and the standard deviation of these positions can vary from a precise array by as much as 10% of the average center-to-center domain spacing (see Cheng et. al., *Advanced Materials* 2006, 18, 2505). A variation of this magnitude makes such a directed self-assembled method unsuitable for patterning devices requiring a standard deviation $\sigma$ in placement of 3.5% (3$\sigma$~10%) of CD.

Figure 3A:
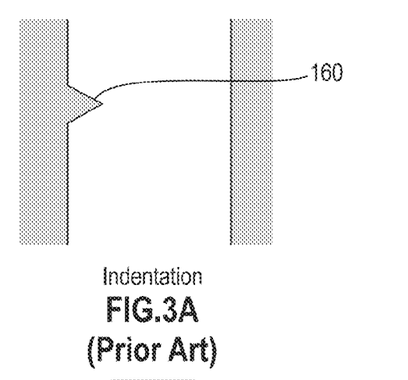
FIGS. 3A, 3B, and 3C, illustrates a prior art technique in which, beginning with a trench (having an indentation therein) in a substrate, multiple holes can be formed using a self-assembled block copolymer, with the indentation determining the registration of the lattice of those holes but not the precise position of each hole.
Figure 3B:
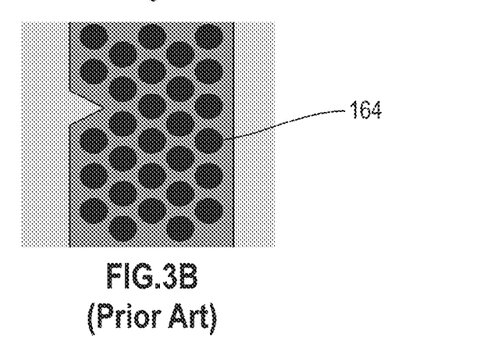
Figure 3C:
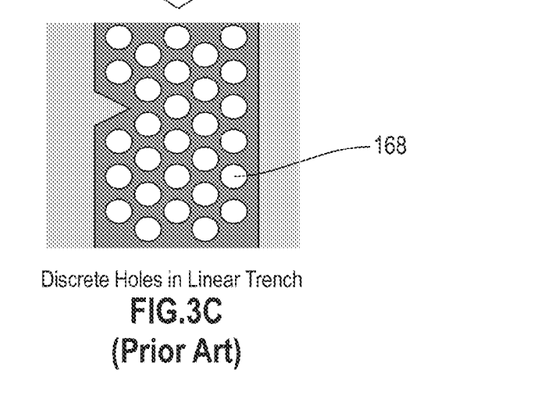

As shown in FIG. 3A, one or more widely separated indentations 160 in the sidewall of a prepatterned trench (made by e-beam lithography) have been incorporated in an attempt to register hexagonal arrays of block copolymer domains (see C. Cheng et. al., *Advanced Materials* 2003, 15, 1599; and Cheng et. al. *Nature Materials* 2004, 3, 823). However, the indentations 160 did not exert enough influence to achieve the desired positional accuracy of the domains 164 (and thus of their corresponding holes 168), nor did they break the hexagonal symmetry of the corresponding array.

SUMMARY

DSA patterning methods of constructing vias are disclosed herein, which take advantage of the small CDs of BCP domains while at the same time providing precise control of BCP domain placement for arbitrary pattern layouts, thereby enabling higher resolution patterning. In addition, preferred methods are disclosed that are compatible with conventional optical lithography tools and imaging materials.

Block copolymer graphoepitaxy methods are described herein in which directing features are used to produce arrays of holes at arbitrary, predetermined locations, with these holes being placed with sufficient accuracy to be useful for a variety of applications. Preferred directed self-assembly methods herein can be employed to produce arrays of holes having a hole density that is higher than the density of discrete holes written by optical lithography methods, while achieving precise registration, even for holes that are arbitrarily arranged. This success is in contrast to the prior art, which at most results in hexagonally packed arrays or square arrays that can only be approximately described by a period and lattice structure; such arrays are not useful for the vertical interconnect layouts needed for a semiconductor device.

One aspect of the invention is a method that comprises providing a substrate having a surface with an opening therein. The opening has a boundary that includes convex, contoured sidewalls, with the sidewalls defining protrusions where they adjoin. The sidewalls have a cross section at the surface of the substrate that is given by respective segments each of whose average radius of curvature is less than 100 nm (although this average radius of curvature may be the same or different for different segments). The method further comprises applying, over the surface, a layer of polymer that includes a block copolymer, in which components of the copolymer are immiscible with one another. The polymer is allowed to form a plurality of discrete, segregated domains inside the opening (e.g., an annealing process may be used to induce this self-assembly), in which i) the position of each discrete, segregated domain is predetermined by at least one sidewall and a protrusion that forms at least part of said at least one sidewall, and ii) the domains have respective geometric centers, and for any given domain, its center and the center of the given domain's nearest neighbor are separated by a distance that is less than the sum of a) the average radius of curvature of the segment (or the mean of the average radii of curvature of the segments) corresponding to said at least one sidewall that predetermines the position of the given domain and b) the average radius of curvature of the segment (or the mean of the average radii of curvature of the segments) corresponding to said at least one sidewall that predetermines the position of the given domain's nearest neighbor. (That is, if only one sidewall determines the position of a certain domain, then the average radius of curvature of the corresponding segment is used in calculating this sum, but if multiple sidewalls determine the position of a certain domain, then the mean of the various radii of curvature of the segments corresponding to those multiple sidewalls is used.) The separation of adjacent domains may advantageously differ from that which would be realized on a topographically planar substrate (of the same material) that did not include the opening, e.g., the relative positions of 3 or more adjacent domains may differ from those which would be obtained on a topographically planar substrate (of the same material) that did not include the opening. The substrate may be any one of a number of different materials, and the holes may be formed in a resist, a hardmask, or an antireflection coating, either directly or as part of a multistep process.

Another aspect of the invention is a method of forming a self-assembled copolymer pattern over a substrate. A layer is applied over an opening in a substrate, with the opening having a boundary defined at least in part by various directing features, and the applied layer includes a block copolymer. The block copolymer is allowed to form a plurality of discrete, segregated domains within the opening (e.g., as a result of an annealing process), in which the position of each discrete, segregated domain is determined by at least one directing feature. These directing features may advantageously include protrusions in the boundary of the opening. For example, the domains might, in the absence of the features, form an array having a particular density and a particular periodicity, but because of the features they form a pattern that is not characterized by said particular density and said particular periodicity (e.g., the domains may have a density that is greater than that given by said particular density). In one implementation of this method (i) at least 4 discrete segregated domains form within the opening and (ii) any given cross section taken through the directing features and the discrete segregated domains would have no cross section of a discrete segregated domain residing completely within any polygon constructed by joining line segments between geometrical centers of 3 or more cross sections of discrete segregated domains within the given cross section.

Another aspect of the invention is a method that includes providing a substrate having a surface with an opening therein, in which the opening has a boundary equivalent to that formed from overlapping, substantially cylindrically shaped holes. The sidewalls of the holes define protrusions where they adjoin, and each of the cylindrically shaped holes has an average radius of curvature of less than 100 nm. A layer of polymer (that includes a block copolymer) is applied over the surface, with the components of the copolymer being immiscible with one another. The polymer is allowed to form a plurality of discrete, segregated domains inside the opening, in which i) the position of each discrete, segregated domain is predetermined by at least one sidewall and a protrusion that forms at least part of said at least one sidewall, and ii) the domains have respective geometric centers, and for any given domain, its center and the center of the given domain's nearest neighbor are separated by a distance that is less than the sum of the average radii of curvature of the cylindrically shaped holes corresponding to the sidewalls that predetermine the positions of the given domain and the given domain's nearest neighbor, and iii) a single, discrete, segregated domain resides within each portion of the opening corresponding to one of the cylindrically shaped holes. The method preferably further comprises removing at least some of the discrete, segregated domains, thereby creating holes that are then transferred into the substrate and backfilled with a material.

BRIEF DESCRIPTION OF THE DRAWINGS

FIGS. 1-7 show respective plan or top-down views (except FIG. 4D, which represents a 3-dimensional view), in which:

FIG. 1, which includes

FIG. 2, which includes

FIG. 3, which includes

FIG. 4, which includes

FIG. 5, which includes

DETAILED DESCRIPTION

Block copolymer graphoepitaxy methods are described herein that lead to the formation of holes, in either regular arrays or arbitrary arrangements. Preferred methods rely on the use of a substrate with an opening therein, with this opening having a segmented pattern that is chosen in such a way that all of the discrete domains are formed at predetermined positions. Holes (or vias) are then formed at these positions, and these holes can then be transferred into the underlying substrate. These holes may then be backfilled with material, such as a metallic conductor (e.g., to form interconnects). The segmented pre-patterns disclosed herein are highly structured in contrast to the prior art, in which low-dimensional topographical objects (e.g., linear trenches) are used or isolated indentations are employed to crudely position at most a few of the block copolymer domains of an hexagonal array of domains.

Beyond the 22 nm node, optical lithography may be incapable of the resolution required to create discrete openings that would lead to the formation of a single self-assembled hole within each opening. While larger, featureless prepatterns might be able to accommodate multiple self-assembled domains to achieve a higher pattern density, they cannot impart sufficient control on the final position of each of the self-assembled domains. In preferred aspects of the invention, optical lithography is used to fabricate one or more segmented prepatterned openings within a substrate. The segmented prepattern opening has a number of directing features or "protrusions" that direct and control the position of each self-assembled domain to achieve the desired placement accuracy. Such a substrate can advantageously be fabricated using optical lithography, which has a resolution that is inherently lower than that of e-beam lithography, for example. In the context of optical lithography, a segmented prepattern opening can be considered to be the result of combining a number of overlapping discrete (typically cylindrical) holes, each of which is of a dimension that can be resolved by optical lithography. In other words, preferred aspects of the invention employ a prepattern opening to direct the self-assembly of block copolymers. In place of smaller discrete openings, a larger structured opening is created that can ultimately contain multiple self-assembled domains, yet this structured opening has enough directing features within its sidewalls that the position of each self-assembled domain can be controlled.

Figure 4A:
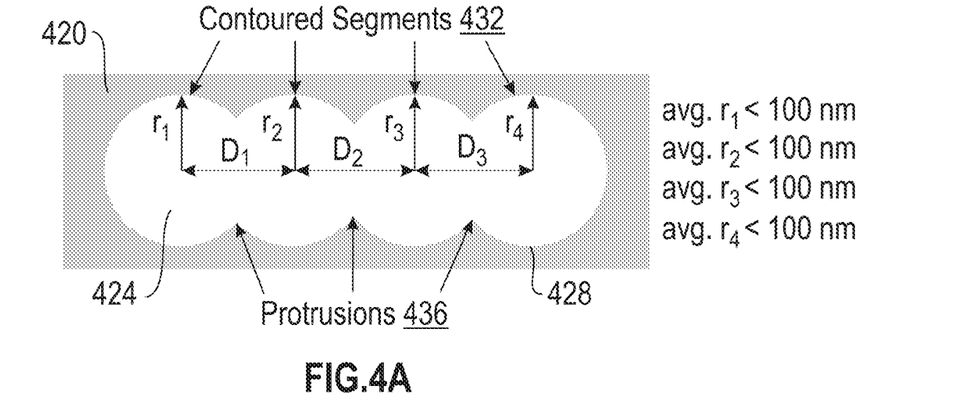
FIGS. 4A, 4B, 4C, and 4D illustrates a preferred aspect of the invention in which multiple holes are formed within a segmented prepattern using a polymer assembly that includes a block copolymer, and in which the features of the segmented prepattern position the discrete, segregated BCP domains with increased precision relative to that achieved with a non-segmented prepattern (e.g., as in FIG. 2 or 3)

Preferred aspects of the invention described herein use a substrate having a segmented prepattern (of a certain geometry) to achieve the desired placement accuracy of self-assembled domains. (The term "substrate" is used broadly to mean any physical structure suitable for use with any of the methods described herein, including but not necessarily limited to substrates used in the semiconductor industry.) By way of example, FIG. 4A illustrates a plan view of a substrate 420 having an opening 424 therein, whose geometry will now be described. FIG. 4D shows the corresponding 3-dimensional representation and should be viewed in conjunction with FIG. 4A. The opening 424 can be thought of as arising from the overlap of more than one hole in the substrate 420. Each of the overlapping holes is cylindrical in form, having sidewalls 428 that are vertical or substantially vertical (i.e., perpendicular to the substrate). The boundary of the opening 424 (at the surface of the substrate 420) thus can be viewed as the overlap of circles that, in the case of cylinders (which have vertical sidewalls), are the projection of the cylindrical holes onto the plane of the substrate. The perimeter of the opening 424 (at the surface of the substrate 420) is therefore defined by the circular arcs 432 associated with these overlapping circles, each of which has a radius of curvature. In other words, FIG. 4A can be regarded as showing a planar cross section of the sidewalls 428 taken at the top of the sidewalls (i.e., at the top surface of substrate 420). The perimeter of the sidewalls within this plane is defined by circular arcs 432 having respective radii of curvature $r_j$ of less than 100 nm.

More generally, the overlapping holes may be contoured and convex but may not be ideally cylindrical, so that an average radius of the hole at the surface of the substrate 420 may be used instead. For example, the cross sections of the holes may deviate from circles and the sidewalls may be sloped (conical holes) or have more complex shapes (e.g., as with a teardrop shaped holes). For these more complex cases, the average radius of curvature may be taken as the radius of the equivalent cylindrical hole having the same displacement volume. The sidewalls 428 of the opening 424 adjoin where the holes intersect, where the sidewalls define protrusion members or protrusions 436. Thus, a given protrusion 436 may be viewed as part of, and formed from, two adjacent sidewalls.

While the segmented prepatterns shown in FIG. 4A arise from the overlap of circular holes, in practice the actual holes of a given opening may not be ideally circular due to limitations of the lithography, including the non-ideal response of the resist or other processing steps. It should be understood that such deviations are considered to be within the scope of this invention. Thus, the average radius of curvature of a segment may be taken to be that of the equivalent circular opening that would be produced at the given location on average. That is to say, if a large statistical sample of such an opening were made, any individual hole might deviate from the ideal circular form, but for the sample viewed as a whole, these deviations would average out. Alternatively, for any segment having a non-circular contour, its average radius of curvature can be determined using an algorithm based on the Hough transform (see, for example, William K. Pratt, "Digital Image Processing", second edition, Wiley-Interscience Publication, ISBN 0-471-85766-1, 1991).

Figure 4B:
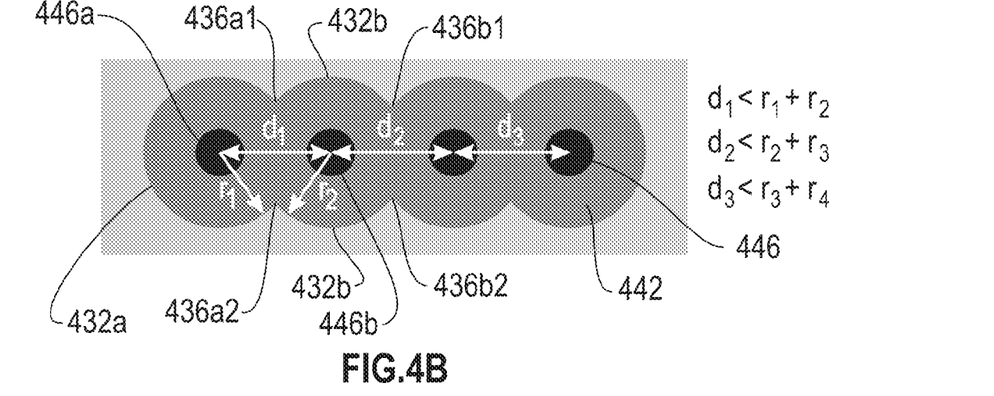

As shown in FIG. 4B, a formulation containing a block copolymer (and possibly other additives, as described below) is applied over the substrate 420 and annealed to form domains 442, 446. As shown in FIG. 4B, the domains 442, 446 phase separate, with domain 446 being surrounded by domain 442. On the sidewalls 428, there may (or may not) be a thin coating of the polymer (brush layer) corresponding to the domain 442 as a result of this phase separation process, depending upon the surface chemistry of the prepattern and the composition of the block copolymer used.

Figure 4C:
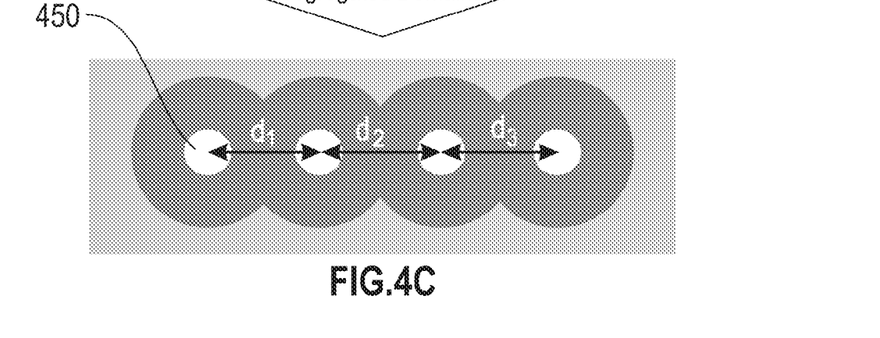
Figure 4D:
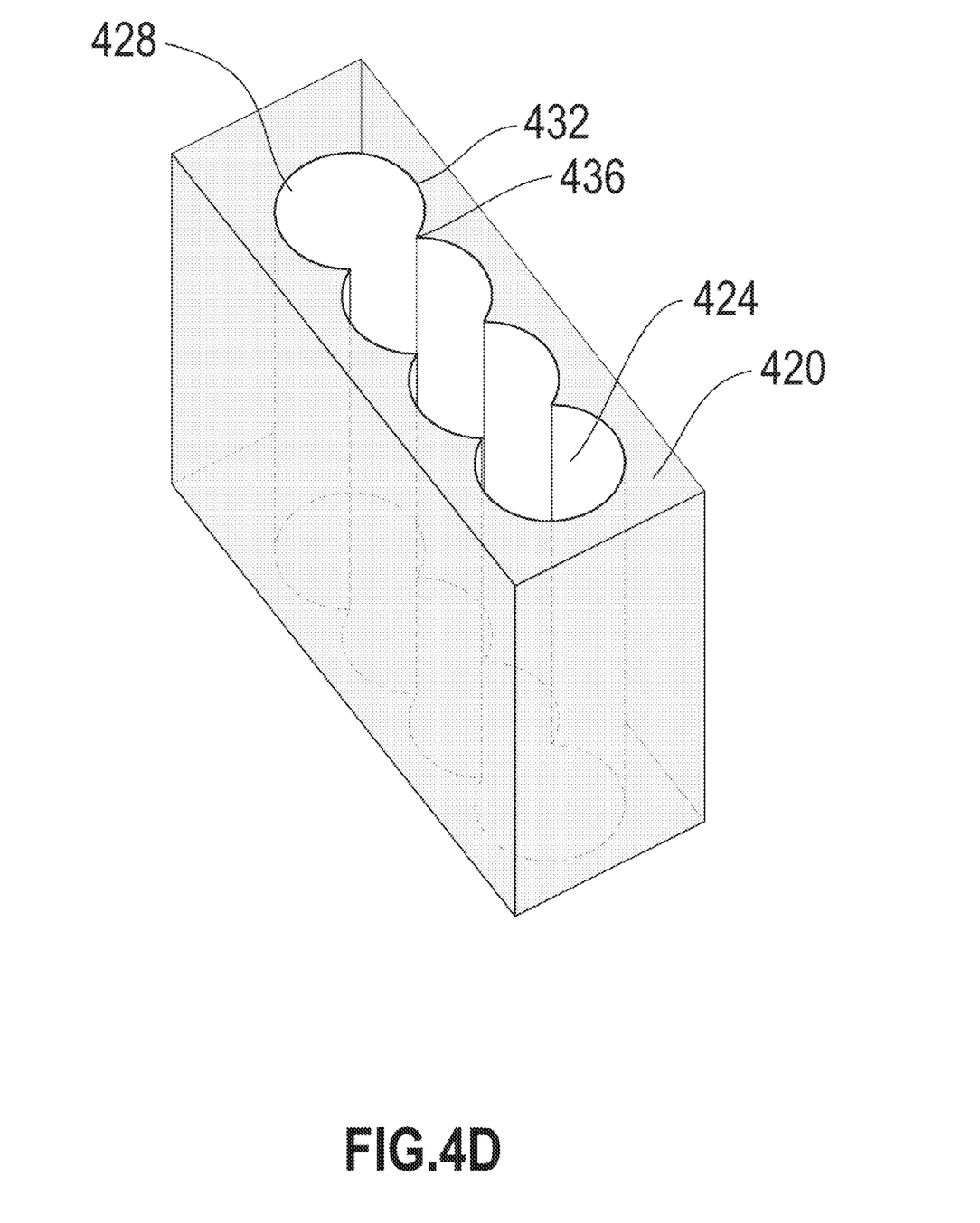

The self-assembled, discrete segregated domains 446 have respective geometric centers whose positions are determined by at least one sidewall 428 and its corresponding protrusion(s) 436. For example, the position of the geometric center of domain 446a is determined by the sidewall corresponding to segment 432a extending between the two protrusions 436a1 and 436a2, with assistance from those two protrusions. On the other hand, the geometric center of the adjacent domain 446b is determined by two sidewalls corresponding to segments 432b (extending between respective pairs of protrusions 436a1 and 436b1, and 436a2 and 436b2), with assistance from those four protrusions. Thus, the sidewalls 428 with their protrusions 436 may be viewed as "directing features", since they predetermine the location of (or direct) the domains 446 at points where their respective free energies are minimized. As indicated in FIG. 4C, the domains 446 may be selectively removed to form holes that can then be transferred to the underlying substrate 420, thereby forming a pattern of contact holes or vias 450. The domains 446 may be removed, for example, by using a development process (such as developing them in aqueous base developer), by dissolving them in solvent, or by etching them away with a plasma. The selected process removes the polymer of the domains 446 while leaving behind the polymer of the domains 442.

As indicated in FIG. 4A, the various segments 432 may be viewed as portions of circles whose centers are separated by respective distances $D_j$. Indeed, the perimeter of the sidewalls 428 (at the surface of the substrate 420) can be defined by distances $D_j$ and radii of curvature $r_j$ associated with the segments 432. Furthermore, the geometrical centers of the discrete segregated domains 446 are located such that adjacent segregated domains are separated by a distance $d_j$ that is less than the sum of a) the average radius of curvature of the segment (or the mean (arithmetic average) of the average radii of curvature of the segments) corresponding to the (at least one) sidewall that predetermines the position of the given domain and b) the average radius of curvature of the segment (or the mean of the average radii of curvature of the segments) corresponding to the (at least one) sidewall that predetermines the position of the given domain's nearest neighbor. That is, if only one sidewall determines the position of a certain domain (as is the case with domain 446a), then the average radius of curvature of the corresponding segment (432a) is used in calculating this sum, but if multiple sidewalls determine the position of a certain domain (as is the case with domain 446b), then the mean of the various radii of curvature of the segments (432b, top and bottom) corresponding to those multiple sidewalls is used. As indicated in FIG. 4B: $d_1<r_1+r_2$; $d_2<r_2+r_3$; and $d_3<r_3+r_4$. In the preferred case that the centers of the segregated domains 446 are located at the centers of the circles corresponding to the segments 432, then $D_j=d_j$. The contoured sidewalls 428 and their protrusions 436 can be formed with optical lithography, so that the domains 446 (and thus their corresponding vias 450) can be positioned according to a preselected layout.

Figure 5A:
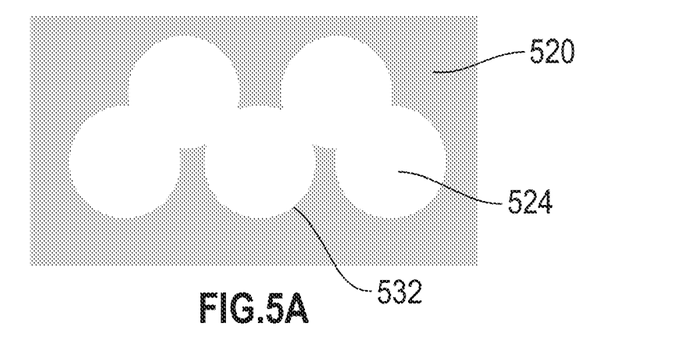
FIGS. 5A, 5B, and 5C, illustrates a preferred aspect of the invention in which multiple holes form a segmented prepattern, using a polymer assembly that includes a block copolymer, and in which the features of the segmented prepattern position the discrete, segregated BCP domains into an arrangement of rows and diagonals with increased precision relative to that achieved with a non-segmented prepattern.
Figure 5B:
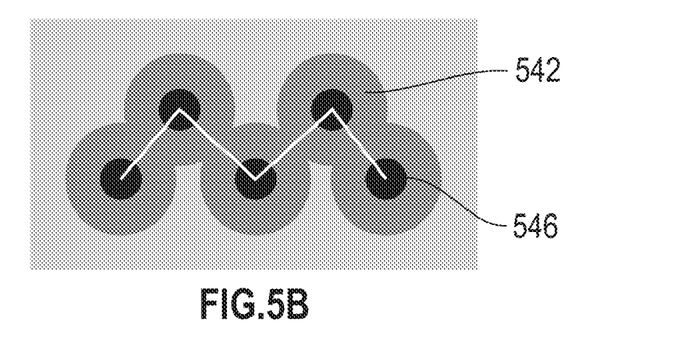
Figure 5C:
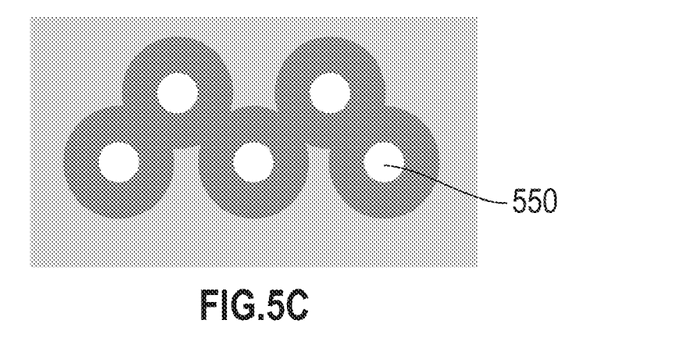

FIGS. 5A, 5B, and 5C show another aspect of the invention in which discrete segregated domains 546 are not aligned along a single axis, but rather form "rows" and "diagonals". In this case, a substrate 520 has an opening 524 defined by sidewalls corresponding to segments 532, and domains 542 and 546 are formed as a result of applying a block copolymer solution over the substrate, and then annealing the solution. The segregated domains 546 can then be etched away, and the resulting vias 550 transferred into the underlying substrate 520. Note, however, that for this particular implementation of the invention, the domains 546 (corresponding to the vias 550) are confined to the perimeter of the opening 524—there is no domain (or corresponding via) that resides completely within any polygon constructed by joining line segments between the centers of any three or more of the domains 546 (or the vias 550). More precisely, there is no domain whose cross section (within the plane of the polygon) lies completely within the polygon, with the polygon being formed by joining the geometrical centers of three or more of the domains' cross sections (defined by that plane).

An advantage of preferred aspects of the invention is that the sidewalls (and their protrusions) can be formed using optical lithography. Because the adjacent discrete segregated domains 446 and 546 of FIGS. 4 and 5 are separated by a distance that is less than the sum of the average radii of curvature of the corresponding circles (e.g., see FIG. 4B), the segregated domains 446 and 546 (and their corresponding holes 450 and 550) can be "printed" at a desired aerial density with lower resolution lithography than would otherwise be needed. Accordingly, the segregated domains 446 and 546 (and their corresponding holes 450 and 550) do not need to conform to any particular symmetry or natural periodicity of block copolymers. For example, by extending the rows of FIG. 5 and forming additional rows, a standard square grid layout can be formed. Furthermore, the center-to-center distance between adjacent discrete segregated domains 446 (or 546) can be predetermined by the sidewalls corresponding to segments 432 (or 532) or by other directing features.

The segmented prepatterns defined by the openings 424 and 524 may be advantageously formed by lithographic techniques, e.g., e-beam or optical lithography. In the case of electron-beam lithography, the segmented prepatterns may be generated directly on the resist. If optical lithography is used to form a segmented prepattern defined by the openings 424 and 524, a specific mask can be used with a photoresist applied to a substrate, and then exposing the applied photoresist to optical radiation (e.g., 248 nm or 193 nm). The exposure may also be performed using immersion lithography. The segmented prepattern may be formed using a single exposure or multiple exposure process. DSA can be performed directly in the negative-tone resist pattern. If the DSA is to be performed in the positive-tone resist pattern, some treatment of the resist material may be necessary so that the resist pattern is insoluble in the casting solvent of the block copolymer (and any other additives). For example, treating the positive-tone resist pattern with a surface crosslinking agent or material may be used. Otherwise, the resist pattern can be transferred into the underlying bottom anti-reflective coating, a hardmask layer (e.g., an oxide or nitride material), or a transfer layer (a crosslinked organic resin) followed by removing the resist and optionally modifying the surface. These patterns are generally stable to the block copolymer casting solvents and would not require additional stabilization treatments.

In addition, a segmented prepattern may be formed by a double patterning process. In one embodiment, a pattern is imaged into a first photoresist and transferred into an underlying hardmask. After removing the remaining first resist, a second resist is cast onto the patterned hardmask and imaged to form a second photoresist pattern. The second photoresist pattern is then transferred into the hardmask. The transferred (overlapping) patterns from the first and second photoresists are combined in the hardmask layer to form a single segmented pattern which can be used to direct the assembly of the block copolymers.

Once the structures shown in FIGS. 4A and 5A are made, self-assembly of the diblock copolymer on them is carried out. This process is summarized here and described in more detail below. First, a polymer solution containing at least one block copolymer (BCP) is prepared. Additional BCPs, homopolymers, copolymers, surfactants and photoacid generators in the solution may also be employed. Next, the solution is cast on the substrate having the segmented prepattern, to form well-registered polymer domains within the desired area. Increasing the mobility of the block polymers (e.g., through baking or solvent vapor treatment) is required for certain polymers, such as PS-b-PMMA (a di-block copolymer of polystyrene (PS) and polymethylmethacrylate). For block copolymers for which the glass transition temperature is lower than room temperature, spontaneous self-assembly may occur. Additional annealing (including thermal annealing, thermal gradient annealing, solvent vapor annealing or some other gradient field) may be optionally employed to remove any defects. Finally, at least one self-assembled polymer domain is selectively removed to generate holes, which can then be transferred into the underlying substrate. For example, both bilayer (resist and transfer layer) and trilayer (resist, hard mask layer, transfer layer) schemes are possible (see, for example, "Introduction to Microlithography", second edition, edited by Larry F. Thompson, C. Grant Willson and Murrae J. Bowden, American Chemical Society, Washington, D.C., 1994). Prior to the pattern development and pattern transfer, the self-assembled polymer may be optionally chemically modified to improve properties necessary for pattern transfer, such as etch resistance or certain mechanical properties.

A copolymer as used herein is a polymer derived from more than one species of monomer. A block copolymer as used herein is a copolymer that comprises more than one species of monomer, wherein the monomers are present in blocks. Each block of the monomer comprises repeating sequences of the monomer. A formula (1) representative of a block copolymer is shown below:

$$-(A)_a\text{-}(B)_b\text{-}(C)_c\text{-}(D)_d\text{-}\ldots\text{-}(Z)_z\text{-} \quad (1)$$

wherein A, B, C, D, through Z represent monomer units and the subscripts "a", "b", "c", "d" through "z", represent the number of repeating units of A, B, C, D through Z, respectively. The above-referenced representative formula is not meant to limit the structure of the block copolymer used in the present invention. The aforementioned monomers of the copolymer may be used individually and in combinations thereof in accordance with the methods of the present invention.

A di-block copolymer has blocks of two different polymers. A formula (2) representative of a di-block copolymer is shown below:

$$-(A)_m\text{-}(B)_n\text{-} \quad (2)$$

in which the subscripts "m" and "n" represent the number of repeating units of A and B, respectively. The notation for a di-block copolymer may be abbreviated as A-b-B, where A represents the polymer of the first block, B represents the polymer of the second block, and -b- denotes that it is a di-block copolymer of blocks of A and B. For example, PS-b-PMMA represents a di-block copolymer of polystyrene (PS) and polymethylmethacrylate (PMMA). In addition to linear block copolymers, block copolymers with other architecture also can be used for DSA, e.g., star copolymers, branched copolymers, hyperbranched copolymers, and grafted copolymers.

The blocks can in general be any appropriate microdomain-forming block to which another, dissimilar block can be attached. Blocks can be derived from different polymerizable monomers, where the blocks might include but are not limited to: polyolefins including polydienes, polyethers including poly(alkylene oxides) (such as poly(ethylene oxide), poly(propylene oxide), poly(butylene oxide), or random or block copolymers of these), poly((meth)acrylates), polystyrenes, polyesters, polyorganosiloxanes, polyorganogermanes, and the like.

The blocks of the block copolymer might comprise as monomers $C_{2\text{-}30}$ olefinic monomers, (meth)acrylate monomers derived from $C_{1\text{-}30}$ alcohols, inorganic-containing monomers including those based on Fe, Si, Ge, Sn, Al, Ti, or a combination comprising at least one of the foregoing monomers. Monomers for use in the blocks might include, as the $C_{2\text{-}30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or α-methylstyrene. The monomers might include, as (meth)acrylate monomers, methyl (meth) acrylate, ethyl (meth)acrylate, n-propyl (meth)acrylate, isopropyl (meth)acrylate, n-butyl (meth)acrylate, isobutyl (meth) acrylate, n-pentyl (meth)acrylate, isopentyl (meth) acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers might be used. Blocks which are homopolymers might include blocks prepared using styrene (e.g., polystyrene blocks), or (meth)acrylate homopolymeric blocks such as poly(methylmethacrylate). Random blocks might include, for example, blocks of styrene and methyl methacrylate (e.g., poly(styrene-co-methyl methacrylate)), randomly copolymerized. An alternating copolymer block might include blocks of styrene and maleic anhydride, which is known to form a styrene-maleic anhydride diad repeating structure due to the inability of maleic anhydride to homopolymerize under most conditions (e.g., poly(styrene-alt-maleic anhydride)). It will be understood that such blocks are exemplary and should not be considered to be limiting.

Furthermore, block copolymers that might be suitable for use in the present methods include diblock or triblock copolymers such as poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the foregoing block copolymers.

The block copolymer desirably has an overall molecular weight and polydispersity amenable to further processing. For example, the block copolymer might have a weight-averaged molecular weight ($M_w$) of 3,000 to 400,000 g/mol. Similarly, the block copolymer might have a number averaged molecular weight ($M_n$) of 1,000 to 200,000. The block copolymer might also have a polydispersity ($M_w/M_n$) of 1.01 to 6, and is not particularly limited thereto. Molecular weight, both $M_w$ and $M_n$, can be determined by, for example, gel permeation chromatography using a universal calibration method, calibrated to polystyrene standards.

The block copolymer formulation may be applied by spin coating it onto the substrate, e.g., at a spin speed from about 1 rpm to about 10,000 rpm, with or without a post-drying process. Other processes may be used for applying the block copolymer formulation to the substrate, such as dip-coating and spray-coating.

As used herein, "phase-separate" refers to the propensity of the blocks of the block copolymers to form discrete microphase-separated domains, also referred to as "microdomains" and also simply as "domains". The blocks of the same monomer aggregate to form domains, and the spacing and morphology of domains depend on the interactions, volume fractions, and number of different blocks in the block copolymer. Domains of block copolymers can form spontaneously while applying them to a substrate such as during a spin-casting step, or they can form as a result of an annealing step. "Heating" or "baking" is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" is used to induce phase separation, and in addition, can be used as a process for reducing or removing defects in the layer of lateral microphase-separated domains. It generally involves heating at elevated temperature above the glass transition temperature of the block copolymers, for a period of time (e.g., several minutes to several days).

Solvents that can be used vary with the solubility requirements of the block copolymer components and the various additives, if any. Exemplary casting solvents for these components and additives include propylene glycol monomethyl ether acetate (PGMEA), ethoxyethyl propionate, anisole, ethyl lactate, 2-heptanone, cyclohexanone, amyl acetate, γ-butyrolactone (GBL), toluene, and the like.

Additives can be selected from the group consisting of: additional polymers (including homopolymers, star polymers and copolymers, hyperbranched polymers, block copolymers, graft copolymers, hyperbranched copolymer, random copolymers, crosslinkable polymers, and inorganic-containing polymers), small molecules, nanoparticles, metal compounds, inorganic-containing molecules, surfactants, photoacid generators, thermal acid generators, base quenchers, hardeners, cross-linkers, chain extenders, and combinations comprising at least one of the foregoing, wherein one or more of the additives co-assemble with the block copolymer to form part of one or more of the self-assembled domains.

A substrate, as used herein, is physical structure suitable for use with any of the methods described herein, including but not necessarily limited to substrates used in the semiconductor industry. This includes a physical body (e.g., a layer or a laminate, a material, and the like) onto which materials (such as polymers, polymeric materials, metals, oxides, dielectrics, etc.) may be deposited or adhered. The substrates herein may include semiconducting materials, insulating materials, conductive materials, or any combination thereof, including multilayered structures. Thus, for example, a substrate may comprise a semiconducting material such as Si, SiGe, SiGeC, SiC, GaAs, InAs, InP and other III/V or II/VI compound semiconductors. A substrate may comprise, for example, a silicon wafer or process wafer such as that produced in various steps of a semiconductor manufacturing process, such as an integrated semiconductor wafer. A substrate may comprise a layered substrate such as, for example, Si/SiGe, Si/SiC, silicon-on-insulators (SOIs) or silicon germanium-on-insulators (SGOIs). A substrate may comprise one or more layers such as a dielectric layer, a barrier layer for copper such as SiC, a metal layer such as copper, a hafnium dioxide layer, a silicon layer, a silicon oxide layer, the like, or combinations thereof. A substrate may comprise an insulating material such as an organic insulator, an inorganic insulator or a combination thereof including multilayers. A substrate may comprise a conductive material, for example, polycrystalline silicon (polySi), an elemental metal, alloys of elemental metals, a metal silicide, a metal nitride, or combinations thereof, including multilayers. A substrate may comprise ion implanted areas, such as ion implanted source/drain areas having P-type or N-type diffusions active to the surface of the substrate.

In the following examples, e-beam lithography was used to generate openings in substrates. E-beam lithography was selected for this purpose because it allows large numbers of different test patterns to be made rapidly without the need for creating expensive photomasks or using state-of-the-art 193 nm immersion lithography tools. However, the segmented prepatterns were made by the superposition of circular patterns of a size that can be printed by state-of-the art optical lithography tools. Thus, these examples or suitable equivalents can be replicated using optical lithography.

EXAMPLES

Segmented prepatterns were fabricated by exposing ZEP resist on a ZEP/silicon oxide/silicon stack using electron-beam lithography. After development of the ZEP, the pattern was etched 35 nm into oxide by a reactive ion etch. Subsequent cleaning of the oxide surface and modification with a polystyrene-(random)-polymethylmethacrylate (PS-r-PMMA) copolymer brush produced a neutral surface (i.e., a surface that is not preferentially wetted by any of the block copolymer domains). A propylene glycol monomethyl ether acetate (PGMEA) solution of polystyrene-(block)-polymethylmethacrylate (PS-b-PMMA, 68 kg/mole-34 kg/mole) and PS (22 kg/mole) was spun-cast on the segmented prepattern in the oxide layer and baked at 200° C. for 5 minutes. The PMMA domains assembled at the center of each semi-enclosure. The self-assembled holes were then fabricated by selectively removing PMMA with acetic acid.

Figure 6:
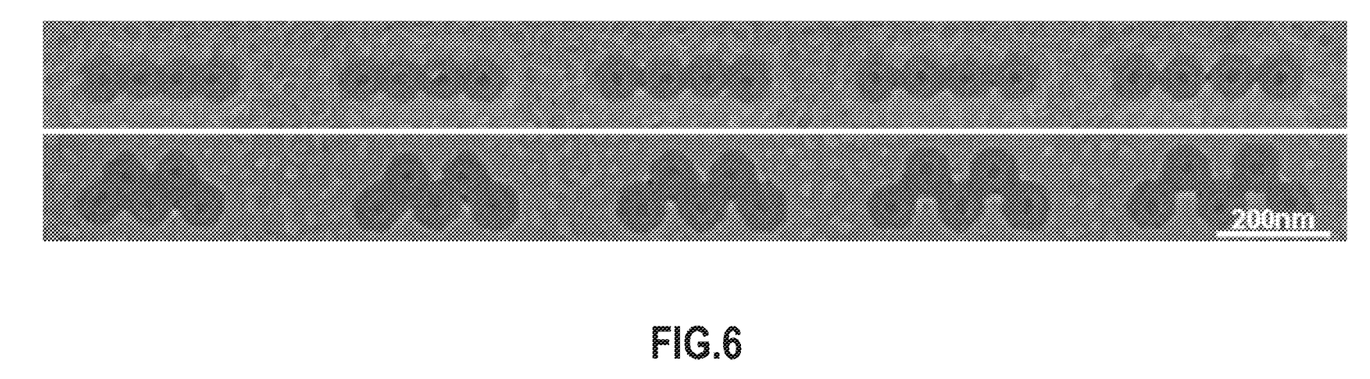
FIGS. 6 and 7 are scanning electron microscopy (SEM) micrographs of various implementations of the invention.

Scanning electron microscopy (SEM) micrographs of directed polymer self-assembly based on linear (as in FIG. 4) and angled (as in FIG. 5) segmented prepatterns are both shown in FIG. 6. FIG. 6 (both panels) show precise placement of self-assembled polymer domains, in which their pitch (the distance between the geometric centers of adjacent domains) is varied from 75 nm to 95 nm, in 5 nm increments (going from left to right). FIG. 6 (top panel) shows these domains arranged along an axis, whereas FIG. 6 (bottom panel) shows that consecutive self-assembled holes can form a sawtooth pattern (defined by imaginary line segments arranged at 90 degrees to each other).

Figure 7:
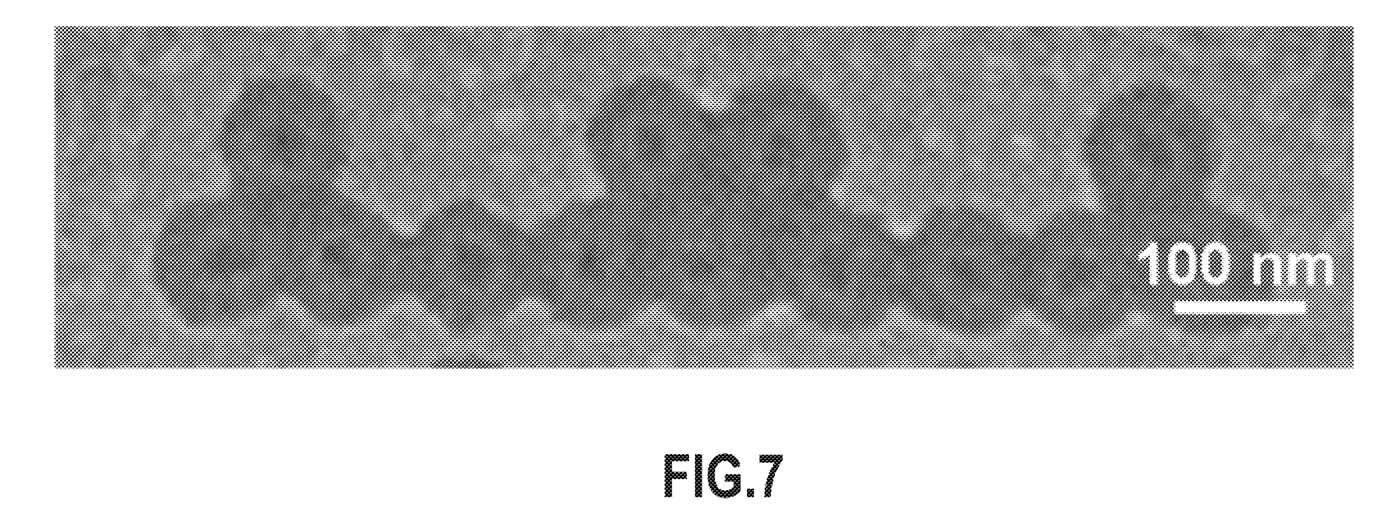

The construction of arbitrarily arranged self-assembled holes can also be achieved using tailored segmented prepatterns, as shown by the SEM micrograph in FIG. 7.

Figure 8:
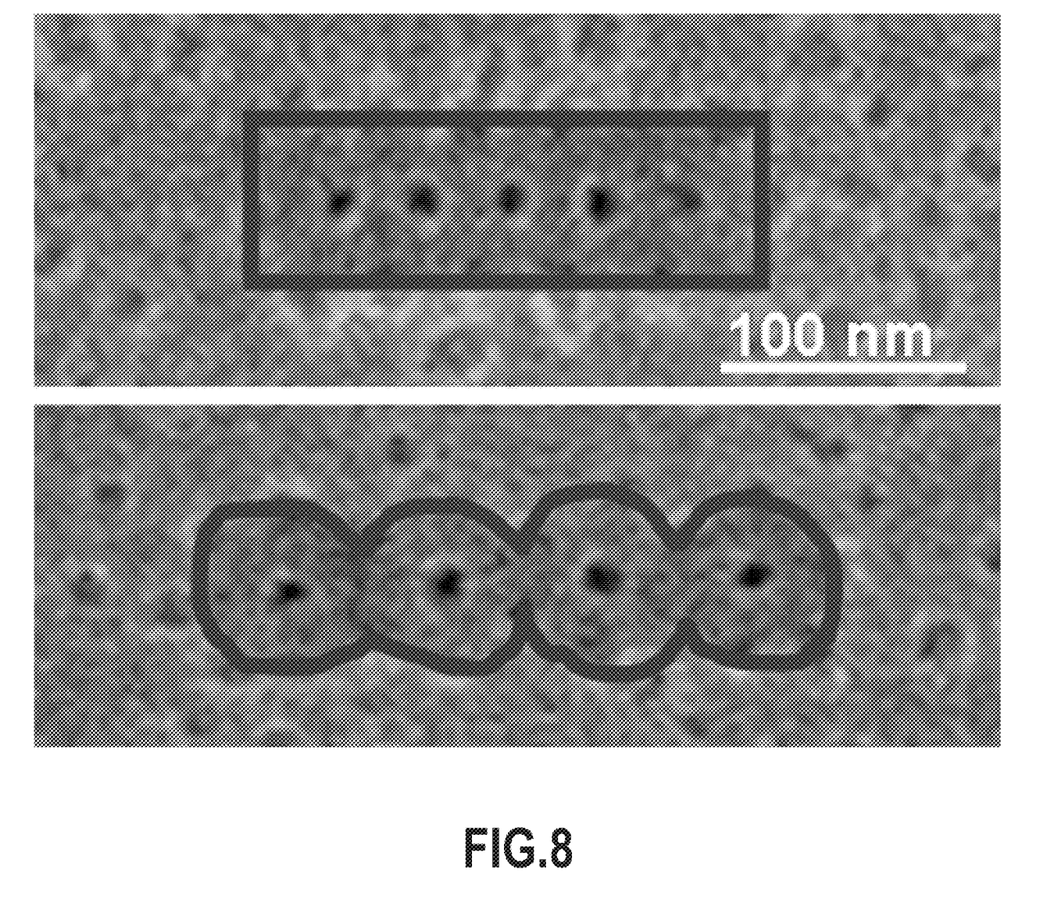
FIG. 8 contrasts SEM micrographs of an implementation of the invention (bottom panel) with a comparative example (top panel), in which the features of the segmented prepattern position the discrete, segregated BCP domains into an arrangement of rows with higher precision (bottom panel) relative to that achieved with a non-segmented prepattern (top panel).

FIG. 8 shows SEM images from two directed self assembly experiments. The upper panel shows vias in a 200 nm×60 nm rectangular trench, whereas the lower panel shows vias in a 260 nm long opening that includes circularly shaped segments whose maximum width is 60 nm. In each case, a 1% PGMEA solution of blend of PS-b-PMMA and PS [PS-b-PMMA (46 kg/mol-21 kg/mol): PS=8:2 weight ratio] was coated on the substrate and baked at 200° C. for 5 minutes.

The vias were formed by removing the PMMA with acetic acid. The rectangular trench (200 nm×60 nm) in the upper panel shows directed self-assembly vias having a center-to-center spacing of 37 nm (σ=4.1 nm), which is close to the center-to-center spacing of 41 nm achieved on a flat substrate that does not have an opening. On the other hand, the contoured opening (260 nm×60 nm, maximum width) in the lower panel shows directed self-assembly vias having a somewhat larger center-to-center spacing of 60 nm, but with a smaller standard deviation (σ=2 nm). This example demonstrates the effect that directing features have on the spacing of directed self-assembly vias: Properly contoured openings have a strong directing effect.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method, comprising:
   providing a substrate having a surface with an opening therein, the opening having a boundary that includes convex, contoured sidewalls, the sidewalls defining protrusions where they adjoin, the sidewalls having a cross section at the surface of the substrate given by respective segments each of whose average radius of curvature is less than 100 nm, wherein the protrusions are designed to control placement of a plurality of discrete, segregated domains inside the opening, and wherein the number of the protrusions is greater than the number of the domains;
   applying, over the surface, a layer of polymer that includes a block copolymer, wherein components of the copolymer are immiscible with one another;
   allowing the polymer to form the plurality of discrete, segregated domains inside the opening, wherein:
   i) the position of each of the discrete, segregated domains is predetermined by at least one of the sidewalls and a protrusion that forms at least part of said at least one sidewall, such that for all discrete, segregated domains inside the opening, their positions and relative spacing are predetermined, and
   ii) the domains have respective geometric centers, and for any given domain, its center and the center of the given domain's nearest neighbor are separated by a distance that is less than the sum of a) the average radius of curvature of the segment (or the mean of the average radii of curvature of the segments) corresponding to said at least one sidewall that predetermines the position of the given domain and b) the average radius of curvature of the segment (or the mean of the average radii of curvature of the segments) corresponding to said at least one sidewall that predetermines the position of the given domain's nearest neighbor.

2. The method of claim 1, wherein the separation of adjacent domains differs from that which would be realized on a topographically planar substrate (of the same material) that did not include the opening.

3. The method of claim 1, wherein the relative positions of 3 or more adjacent domains differ from those which would be obtained on a topographically planar substrate (of the same material) that did not include the opening.

4. The method of claim 1, wherein the respective segments include circular arcs.

5. The method of claim 1, wherein the sidewalls are substantially perpendicular to the surface.

6. The method of claim 1, wherein the respective segments have different average radii of curvature.

7. The method of claim 1, wherein the respective segments are selected to have the same average radii of curvature.

8. The method of claim 1, further comprising:
   removing at least some of the discrete, segregated domains, thereby creating holes; and
   transferring the holes into the substrate.

9. The method of claim 8, comprising:
   backfilling holes in the substrate with a conducting material to form interconnects.

10. The method of claim 8, wherein holes are formed in a resist, a hardmask, or an antireflection coating.

11. The method of claim 1, wherein the block copolymer is selected from the group consisting of poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), and combinations of the foregoing block copolymers.

12. The method of claim 1, comprising forming the opening using optical lithography.

13. The method of claim 1, wherein the polymer forms the discrete, segregated domains as a result of an annealing process.

14. A method, comprising:
   applying a layer over an opening in a substrate, the opening having a boundary defined at least in part by various protrusions in the boundary of the opening, the applied layer including a block copolymer; and
   allowing the block copolymer to form at least 4 discrete, segregated domains within the opening, wherein:
   (i) the position of each of the discrete, segregated domains is determined by at least one sidewall and at least one of the protrusions,
   (ii) any given cross section taken through the protrusions and the discrete segregated domains would have no cross section of a discrete segregated domain residing completely within any polygon constructed by joining line segments between geometrical centers of 3 or more cross sections of discrete segregated domains within the given cross section, and
   (iii) the domains would, in the absence of the protrusions, form an array having a particular density and a particular periodicity, but because of the protrusions form a pattern that is not characterized by said particular density and said particular periodicity.

15. The method of claim 14, wherein the boundary consists essentially of convex, contoured sidewalls.

16. The method of claim 14, wherein the formed segregated domains include 13 discrete, segregated domains.

17. The method of claim 14, wherein for all discrete, segregated domains inside the opening, their positions and relative spacing are predetermined.

18. The method of claim 14, wherein the domains have a density that is greater than that given by said particular density.

19. The method of claim 14, wherein the position of each of some of the domains is determined by at least one of the sidewalls and four of the protrusions.

20. The method of claim 14, wherein the polymer forms the discrete, segregated domains as a result of an annealing process.

21. The method of claim 14, comprising:
selectively removing at least some of the discrete, segregated domains, thereby creating holes that are then transferred into the substrate and backfilled with a material.

22. A method, comprising:
providing a substrate having a surface with an opening therein, the entire opening defined by a boundary equivalent to that formed from overlapping, cylindrically shaped holes having sidewalls, the sidewalls of the holes defining protrusions where they adjoin, each of the cylindrically shaped holes having an average radius of curvature of less than 100 nm, wherein the protrusions are designed to control placement of a plurality of discrete, segregated domains inside the opening;
applying, over the surface, a layer of polymer that includes a block copolymer, wherein components of the copolymer are immiscible with one another;
allowing the polymer to form the plurality of discrete, segregated domains inside the opening, wherein:
i) the position of each of the discrete, segregated domains is predetermined by at least one of the sidewalls and a plurality of the protrusions, the plurality of the protrusions forming at least part of said at least one sidewall, and
ii) the domains have respective geometric centers, and for any given domain, its center and the center of the given domain's nearest neighbor are separated by a distance that is less than the sum of the average radii of curvature of the cylindrically shaped holes corresponding to the sidewalls that predetermine the positions of the given domain and the given domain's nearest neighbor, and
iii) a single one of the discrete, segregated domains resides within each portion of the opening corresponding to one of the cylindrically shaped holes.

23. The method of claim 22, further comprising:
removing at least some of the discrete, segregated domains, thereby creating holes that are then transferred into the substrate and backfilled with a material.

24. The method of claim 1, wherein the position of each of some of the domains is determined by at least one of the sidewalls and more than one of the protrusions.

25. The method of claim 1, wherein the position of each of some of the domains is determined by at least one of the sidewalls and four of the protrusions.

26. The method of claim 14, wherein the number of the protrusions is greater than the number of domains.

27. The method of claim 22, wherein for all discrete, segregated domains inside the opening, their positions and relative spacing are predetermined.

28. The method of claim 22, wherein the position of each of some of the domains is determined by at least one of the sidewalls and four of the protrusions.

29. The method of claim 22, wherein the number of the protrusions is greater than the number of the domains.

30. The method of claim 1, wherein the boundary consists essentially of convex, contoured sidewalls.

31. A method, comprising:
providing a substrate having a surface with an opening therein, the opening having a boundary that consists of convex, contoured sidewalls, the sidewalls defining protrusions where they adjoin, the sidewalls having a cross section at the surface of the substrate given by respective segments each of whose average radius of curvature is less than 100 nm, wherein the protrusions are designed to control placement of a plurality of discrete, segregated domains inside the opening;
applying, over the surface, a layer of polymer that includes a block copolymer, wherein components of the copolymer are immiscible with one another;
allowing the polymer to form the plurality of discrete, segregated domains inside the opening, wherein:
i) the position of each of the discrete, segregated domains is predetermined by at least one of the sidewalls and a plurality of the protrusions, the plurality of the protrusions forming at least part of said at least one sidewall, and
ii) the domains have respective geometric centers, and for any given domain, its center and the center of the given domain's nearest neighbor are separated by a distance that is less than the sum of a) the average radius of curvature of the segment (or the mean of the average radii of curvature of the segments) corresponding to said at least one sidewall that predetermines the position of the given domain and b) the average radius of curvature of the segment (or the mean of the average radii of curvature of the segments) corresponding to said at least one sidewall that predetermines the position of the given domain's nearest neighbor.

32. A method, comprising:
providing a substrate having a surface with an opening therein, the opening having a boundary equivalent to that formed from overlapping, substantially cylindrically shaped holes having sidewalls, the sidewalls of the holes defining protrusions where they adjoin, each of the cylindrically shaped holes having an average radius of curvature of less than 100 nm, wherein the protrusions are designed to control placement of a plurality of discrete, segregated domains inside the opening, and wherein the number of the protrusions is greater than the number of the domains;
applying, over the surface, a layer of polymer that includes a block copolymer, wherein components of the copolymer are immiscible with one another;
allowing the polymer to form the plurality of discrete, segregated domains inside the opening, wherein:
i) the position of each of the discrete, segregated domains is predetermined by at least one of the sidewalls and a protrusion that forms at least part of said at least one sidewall, such that for all discrete, segregated domains inside the opening, their positions and relative spacing are predetermined, and
ii) the domains have respective geometric centers, and for any given domain, its center and the center of the given domain's nearest neighbor are separated by a distance that is less than the sum of the average radii of curvature of the cylindrically shaped holes corresponding to the sidewalls that predetermine the positions of the given domain and the given domain's nearest neighbor, and
iii) a single one of the discrete, segregated domains resides within each portion of the opening corresponding to one of the cylindrically shaped holes.

33. A method, comprising:
providing a substrate having a surface with an opening therein, the opening having a boundary that includes convex, contoured sidewalls, the sidewalls defining protrusions where they adjoin, the sidewalls having a cross section at the surface of the substrate given by respective segments each of whose average radius of curvature is less than 100 nm, wherein the protrusions are designed to control placement of a plurality of discrete, segregated domains inside the opening;

applying, over the surface, a layer of polymer that includes a block copolymer, wherein components of the copolymer are immiscible with one another;

allowing the polymer to form the plurality of discrete, segregated domains inside the opening, wherein:

i) the position of each of the discrete, segregated domains is predetermined by at least one of the sidewalls and a protrusion that forms at least part of said at least one sidewall, ii) the domains have respective geometric centers, and for any given domain, its center and the center of the given domain's nearest neighbor are separated by a distance that is less than the sum of a) the average radius of curvature of the segment (or the mean of the average radii of curvature of the segments) corresponding to said at least one sidewall that predetermines the position of the given domain and b) the average radius of curvature of the segment (or the mean of the average radii of curvature of the segments) corresponding to said at least one sidewall that predetermines the position of the given domain's nearest neighbor, and iii) the domains would, in the absence of the protrusions, form an array having a particular density and a particular periodicity, but because of the protrusions form a pattern that is not characterized by said particular density and said particular periodicity.

34. The method of claim 33, wherein the domains have a density that is greater than that given by said particular density.

35. A method, comprising:

providing a substrate having a surface with an opening therein, the opening having a boundary equivalent to that formed from overlapping, substantially cylindrically shaped holes having sidewalls, the sidewalls of the holes defining protrusions where they adjoin, each of the cylindrically shaped holes having an average radius of curvature of less than 100 nm, wherein the protrusions are designed to control placement of a plurality of discrete, segregated domains inside the opening;

applying, over the surface, a layer of polymer that includes a block copolymer, wherein components of the copolymer are immiscible with one another;

allowing the polymer to form the plurality of discrete, segregated domains inside the opening, wherein:

i) the position of each of the discrete, segregated domains is predetermined by at least one of the sidewalls and a protrusion that forms at least part of said at least one sidewall, and ii) the domains have respective geometric centers, and for any given domain, its center and the center of the given domain's nearest neighbor are separated by a distance that is less than the sum of the average radii of curvature of the cylindrically shaped holes corresponding to the sidewalls that predetermine the positions of the given domain and the given domain's nearest neighbor, iii) a single one of the discrete, segregated domains resides within each portion of the opening corresponding to one of the cylindrically shaped holes, and iv) the domains would, in the absence of the protrusions, form an array having a particular density and a particular periodicity, but because of the protrusions form a pattern that is not characterized by said particular density and said particular periodicity.

36. The method of claim 35, wherein the domains have a density that is greater than that given by said particular density.

\* \* \* \* \*